United States Patent [19]

Podgorski et al.

[11] Patent Number: 5,440,316
[45] Date of Patent: Aug. 8, 1995

[54] BROADBAND ANTENNAS AND ELECTROMAGNETIC FIELD SIMULATORS

[75] Inventors: Andrew S. Podgorski, K1H 5G6; Gary A. Gibson, both of Ottawa, Canada

[73] Assignee: Andrew Podgorski, Canada

[21] Appl. No.: 185,916

[22] PCT Filed: Jul. 30, 1992

[86] PCT No.: PCT/CA92/00323
§ 371 Date: Jan. 27, 1994
§ 102(e) Date: Jan. 27, 1994

[87] PCT Pub. No.: WO93/03387
PCT Pub. Date: Feb. 18, 1993

[30] Foreign Application Priority Data

Jul. 30, 1991 [CA] Canada ................ 2047999

[51] Int. Cl.⁶ .................. H01Q 13/02; G01R 29/08
[52] U.S. Cl. .................. 343/786; 343/703
[58] Field of Search ........... 343/703, 772, 776, 781 R, 343/786; H01Q 13/00–13/06

[56] References Cited

U.S. PATENT DOCUMENTS

| | | | |
|---|---|---|---|
| 3,938,159 | 2/1976 | Ajioka et al. | 343/786 |
| 4,119,951 | 10/1978 | Garon et al. | 343/786 |
| 4,157,549 | 6/1979 | Davis | 343/786 |
| 4,546,358 | 10/1985 | Edlin et al. | 343/703 |
| 4,605,916 | 8/1986 | Tehori | 333/245 |
| 4,905,013 | 2/1990 | Reindel | 343/786 |

FOREIGN PATENT DOCUMENTS 1273060 8/1990 Canada.

*Primary Examiner*—Michael C. Wimer
*Attorney, Agent, or Firm*—Jones, Tullar & Cooper

[57] ABSTRACT

A structure for use in an antenna or as a broadband electromagnetic field simulator, having an open horn TEM waveguide coupled to launch energy in a strip line formed between a forwardly extending plate section and a ground plane. When used as a simulator the test volume is located outside the horn between the forwardly extending plate section and the ground plane. The plate section which functions as a radiating element initially extends parallel to the ground plane and then curves downwardly to terminate adjacent it. In alternative embodiments the plate section extends upwardly, initially with an exponential configuration. In a simulator embodiment it may then terminate at a vertical, grounded wall faced with anechoic material. The horn contains a flat conductor plate positioned parallel to and spaced from the top edge defining an asymmetrical transmission line within the horn. This plate conductor can be coupled to the forwardly extending plate section directly, by means of an RLC coupling network or by means of an array of laterally spaced conductors.

20 Claims, 11 Drawing Sheets

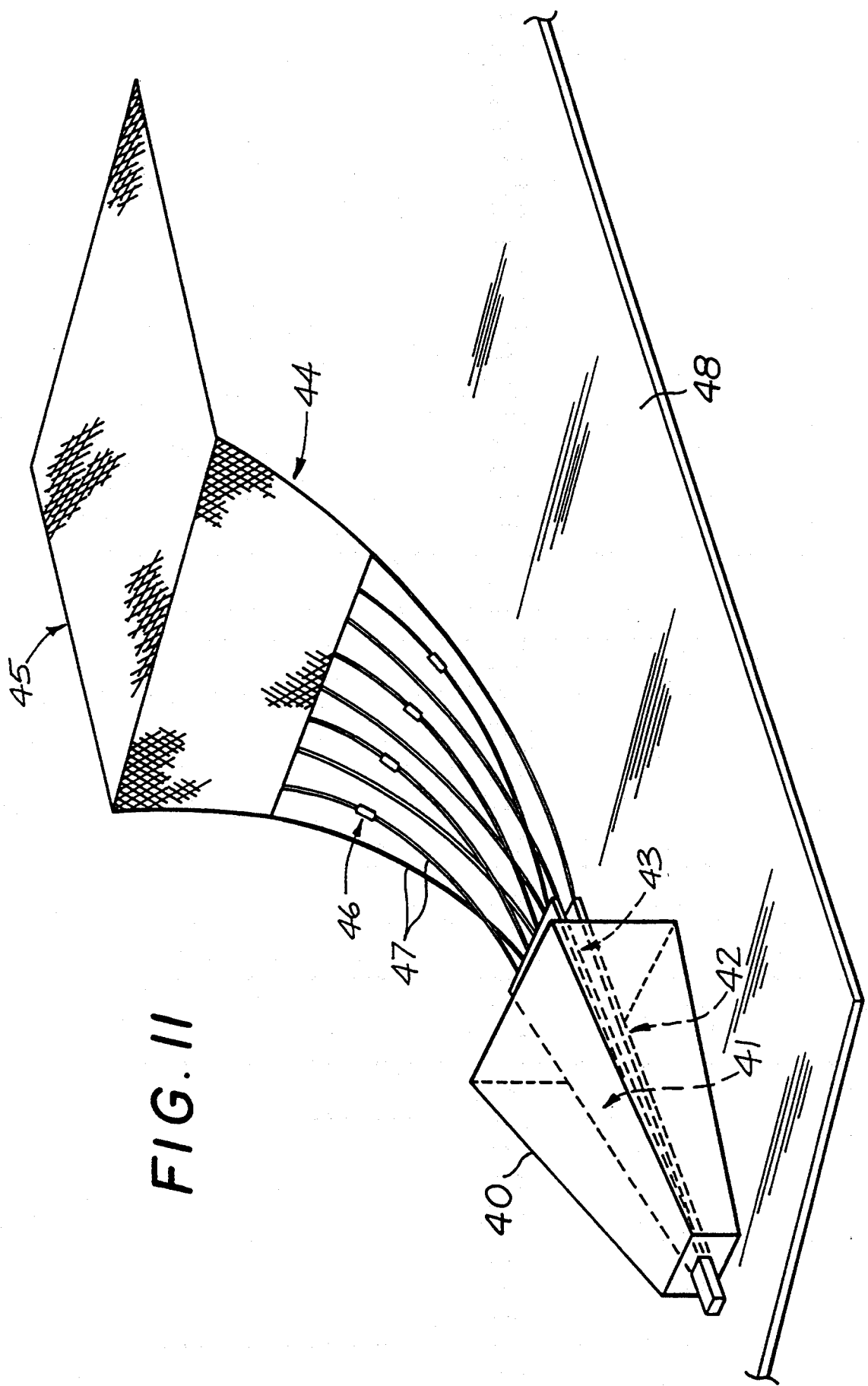

BROADBAND ANTENNAS AND ELECTROMAGNETIC FIELD SIMULATORS

This application relates to electromagnetic radiating structures suitable for use as antennas or as electromagnetic simulators. An electromagnetic simulator is a type of test equipment used for checking the behaviour of equipment in the presence of strong electromagnetic fields.

Continuous Wave (cw) measurement of electromagnetic susceptibility and radiated interference can be carried out using multiple antennas whose electromagnetic properties must be well known in the near field or using TEM cells whose volume and/or frequency limits make them unsuitable for broadband testing of large (few meters in height) electronic sub-systems.

Pulse measurements of electromagnetic susceptibility are currently conducted using parallel line simulators, G-TEM cells or distributed load conical simulators. The parallel line simulators suffer from high frequency limitations. The use of G-TEM cells limits the volume of the tested object and the conical simulator suffers from frequency limitations.

U.S. Pat. No. 4,546,358 issued Oct. 8, 1985 to Edlin et al. discloses a test cell formed in the space between a parallel plate conductor and ground plane which together form a transmission line. The parallel plate conductor is fed by a tapered line section from a coaxial feed, in order to maintain a constant impedance, and the parallel plate conductor terminates in a fluted edge to avoid reflections.

Canadian Patent No. 1,273,060, issued Aug. 21, 1990 to BBC Brown, Boveri & Company, Limited, (U.S. Pat. No. 4,837,581) discloses an EMI testing device using a wave guide of pyramidal shape but with added features. The test device disclosed in this patent has an intermediate plate conductor suspended in the wave guide at a distance of about one quarter of the total height of the wave guide from the top surface. This defines a test volume between the intermediate plate and the wave guide lower surface. Uniform field strength in the test volume is achieved by a complex termination arrangement consisting of a curved wall of high frequency energy absorbing material coupled to the intermediate plate by a number of terminal resistors. The impedance of the line formed by the intermediate plate and the ground plane can be slightly varied, if required for fine tuning, by altering the spacing of the intermediate plate from the upper surface of the wave guide.

Such equipment is unsuitable for the testing of large pieces of electronic equipment. The apparatus described in the present application can be expanded to accommodate larger objects without degradation of the bandwidth.

Generally, the simulator described in this application launches an electromagnetic wave from a high frequency coaxial feed line into an expanding rectangular horn containing a plate conductor forming an asymmetrical parallel line within the horn. The parallel line extends beyond the horn by means of a forwardly extending conducting plate section which functions as a radiating element and establishes a test volume in the space between itself and a ground plane extending forwardly from the lower surface of the horn. The forwardly extending plate section is connected to the parallel line either directly or through a network of parallel inductance and capacitance. Two modes of propagation occur in the horn giving a complete coverage of the relevant frequency spectrum.

Specifically, in one aspect the invention relates to a broadband electromagnetic field simulator comprising: an open horn waveguide and a ground plane conductor formed as a forward extension of the lower surface of the horn. A source of r.f. energy is coupled to the apex of the horn and a relatively narrow conducting plate positioned to form a septum between the upper and lower surfaces of the horn. A plate section of similar configuration to the septum is coupled thereto and extends forwardly from the mouth of the horn. The plate section extends initially substantially parallel to the ground plane and then curves downwardly to terminate adjacent to it. The space between the forwardly extending plate section and the ground plane defines the required test volume.

In an alternative embodiment the plate section extends upwardly, initially with an exponential configuration and then forwardly to terminate at a vertical, grounded wall faced with anechoic material.

When used as an antenna, the structure provides an extremely wide band response due in part to greatly reduced internal reflections. In its antenna aspect, one form of the invention relates to an antenna comprising: an open horn waveguide with a ground plane conductor forming a forward extension of the lower surface of the horn; the apex of the horn being adapted to receive a detector or r.f. source; a relatively narrow conducting plate positioned to form a septum between the upper and lower surfaces of the horn; and a conducting plate section of similar configuration to the septum and coupled thereto and extending forwardly from the mouth of the horn, said plate section extending initially substantially parallel to the ground plane and then curving downwardly to terminate adjacent to it; whereby the forwardly extending plate section functions as a radiating element.

Another form of antenna in accordance with the invention consists of an open horn waveguide with a ground plane conductor forming a forward extension of the lower surface of the horn; a pair of closely spaced conducting plates positioned to form an upper and lower septum, respectively, between the upper and lower surfaces of the horn; a forwardly extending conducting section spaced from and in front of the horn; and a plurality of laterally-spaced conductors connecting the septums to the rear edge of the conducting section; whereby the conducting section functions as a radiating element. Preferably the conductors extending between the front edge of the upper septum and the conducting section each contain a resistive termination. This structure can also function as an electromagnetic simulator.

BRIEF DESCRIPTION OF THE DRAWINGS

Preferred embodiments will be described in conjunction with the accompanying drawings, in which:

FIG. 11 is a further embodiment of a structure in accordance with the invention, which can be used as a simulator or as an antenna.

DESCRIPTION OF PREFERRED EMBODIMENTS

Figure 1:
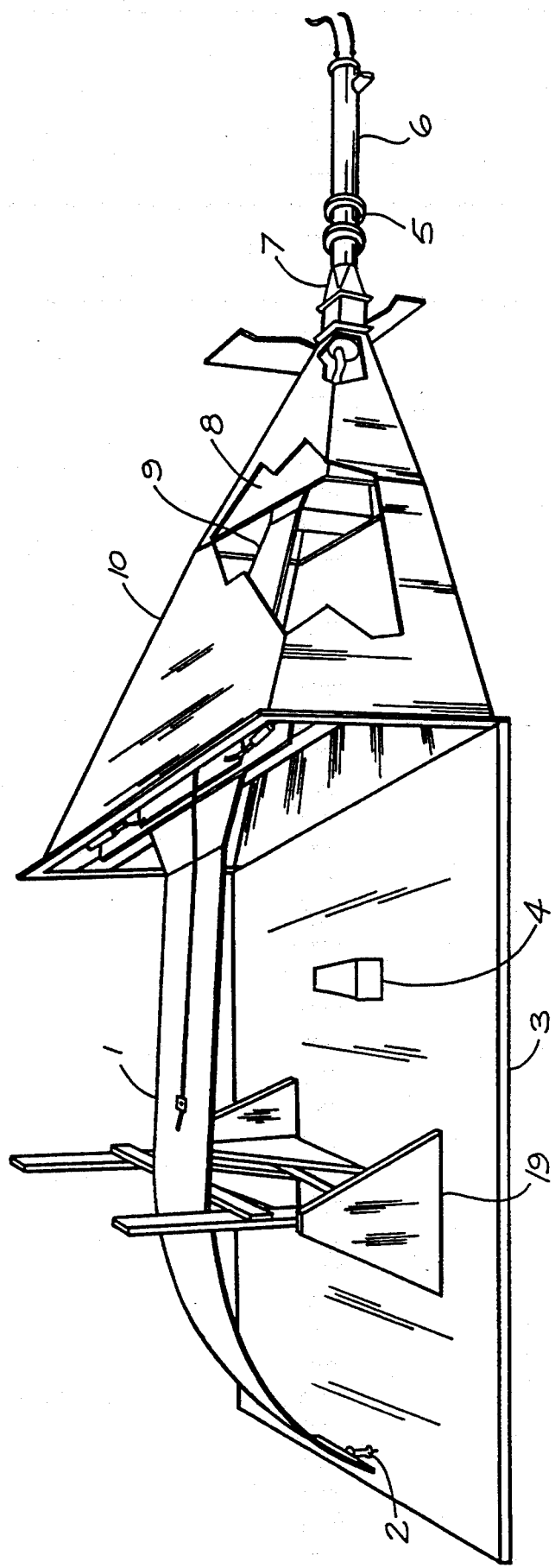
FIG. 1 is a schematic view of one embodiment of a simulator in accordance with the invention.

FIG. 1 shows broadband electromagnetic field simulator in accordance with this invention having an r.f. signal, either pulse or continuous wave, supplied from a generator 6 through a coaxial line 5 to a transition coupling 7 connected to the input of a TEM line formed by horn 10. The aperture of horn 10 is open and a ground plane 3 extends forwardly to form the base of the test volume.

Within the horn a conducting plate or septum 9 is positioned spaced from the upper surface of the horn and with a high voltage dielectric lining 8 therebetween. At the output of the horn a forwardly extending plate section 1 is provided to function as the radiating element in the test apparatus. This plate can be connected either directly to conducting plate 9 or by means of the coupling network shown in FIG. 2. Plate 1 extends forwardly from the horn to a support structure 19 and then curves downwardly towards ground plane 3, being coupled to the ground plane through a terminating resistor 2. Apparatus to be tested, indicated schematically at 4, is located on the ground plane under the forwardly extending radiating element.

Figure 5:
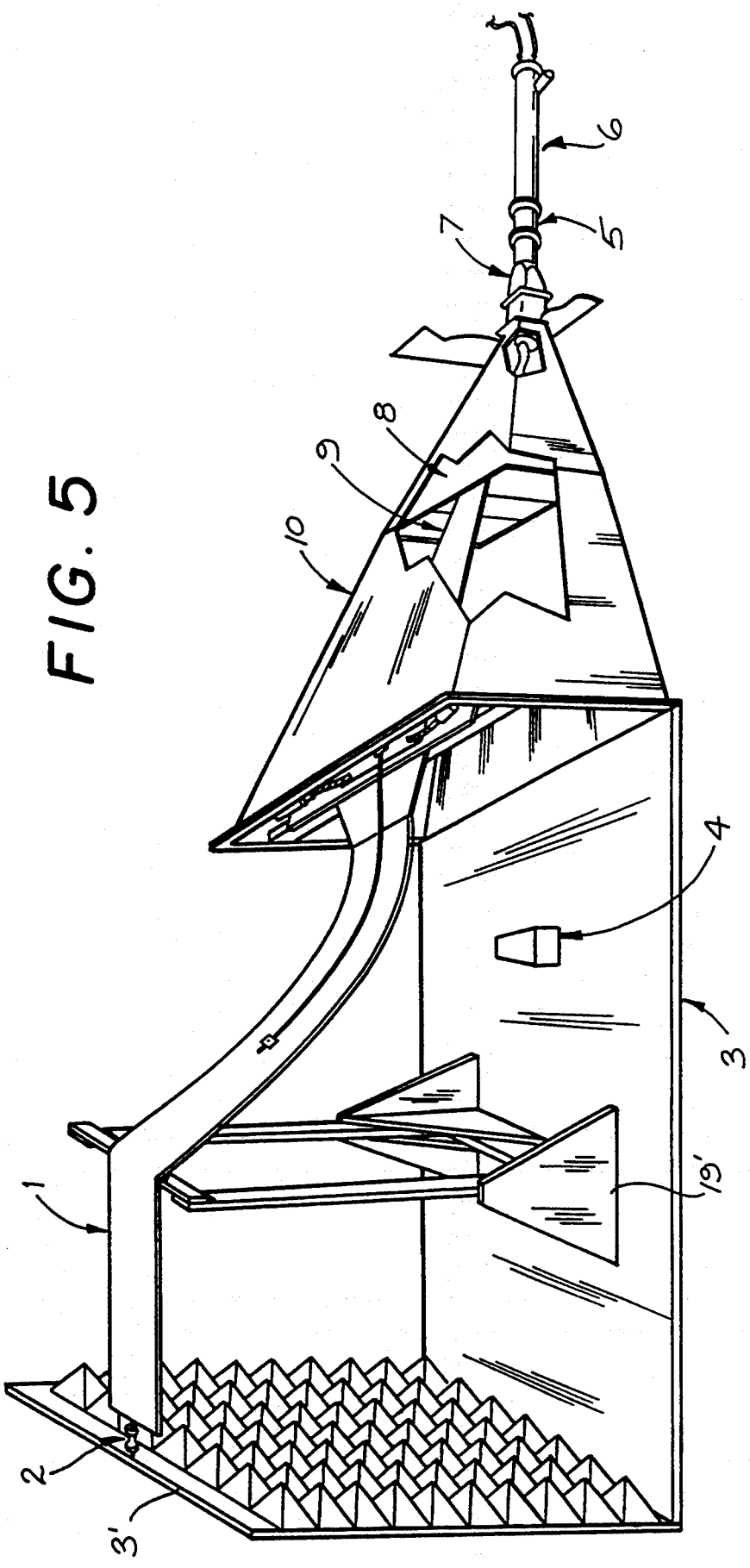
FIG. 5 shows a further embodiment of a simulator in accordance with the invention.

An alternative embodiment, shown in FIG. 5 has plate 1 extending upwardly, initially at an exponential rate, towards a higher Support structure 19' and then extending forwardly to terminate at a vertical ground plane 3' via terminating resistor 2. The side of the vertical ground plane is covered with anechoic material. This permits the testing of objects 4 of larger dimensions.

Figure 2:
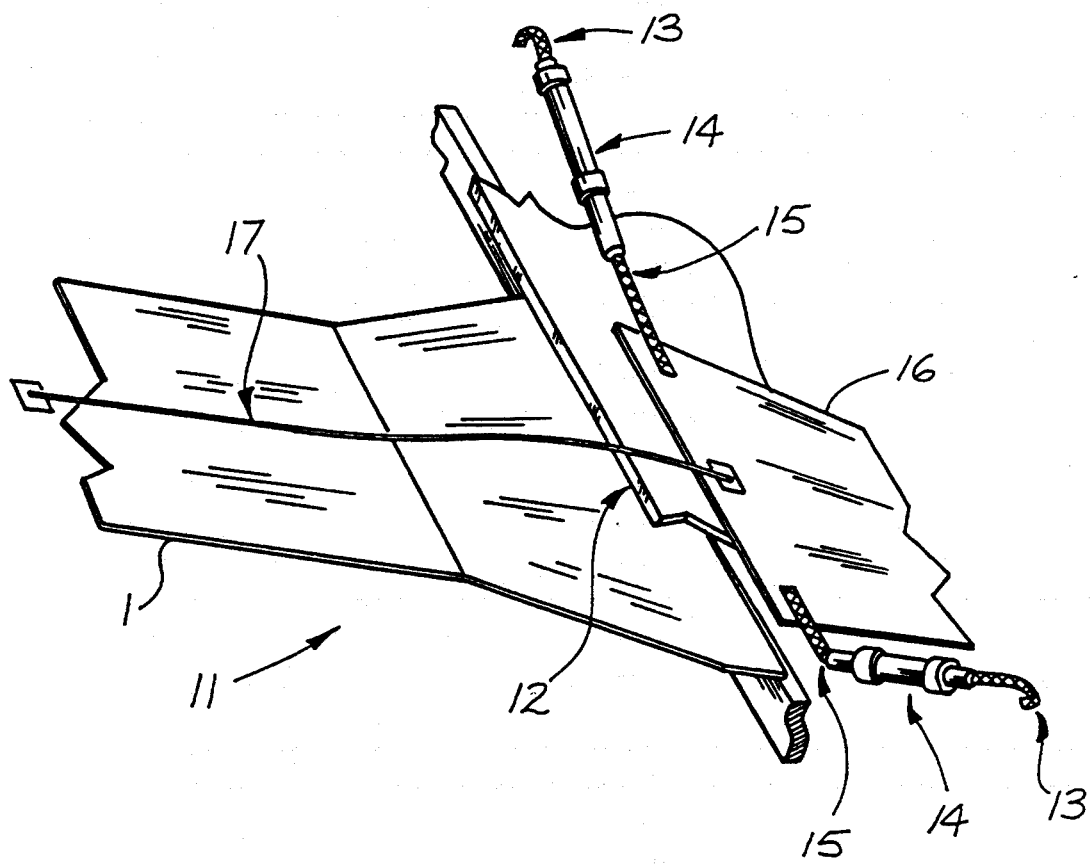
FIG. 2 shows the coupling between the septum within the horn and the forwardly extending plate section.

A preferred manner of coupling the forwardly extending element to the septum in the horn is shown in FIG. 2. The septum shown at 16 forms a capacitor with the radiating element 1 having a dielectric formed by strip 12. An inductance is provided by line 17 extending from the radiating element back to the conductive plate. The edges of the septum are connected to the side walls of the radiating horn through terminating inductances 15 and high voltage terminating resistors 14.

Figure 3:
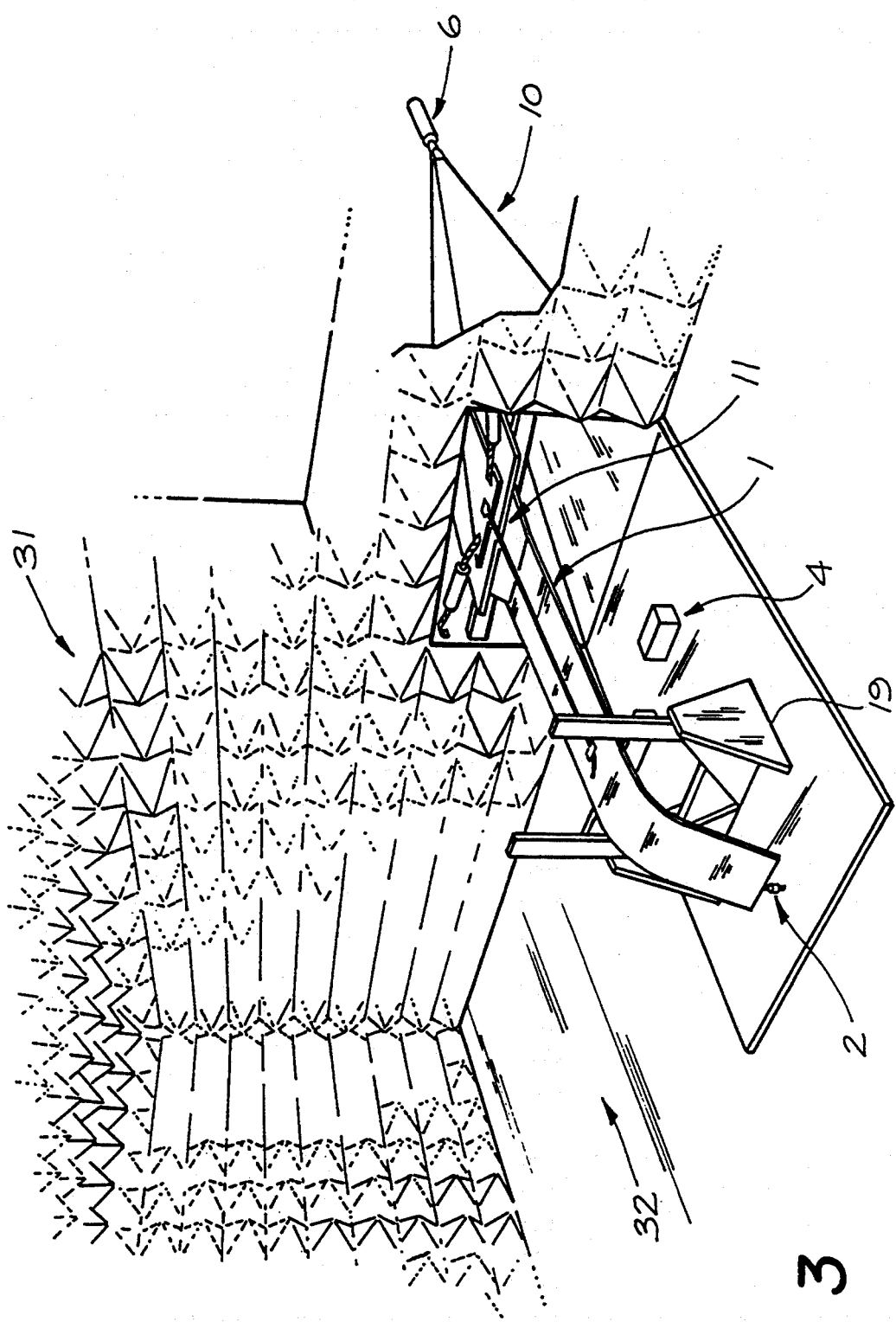
FIG. 3 shows use of the simulator within an anechoic chamber.
Figure 4:
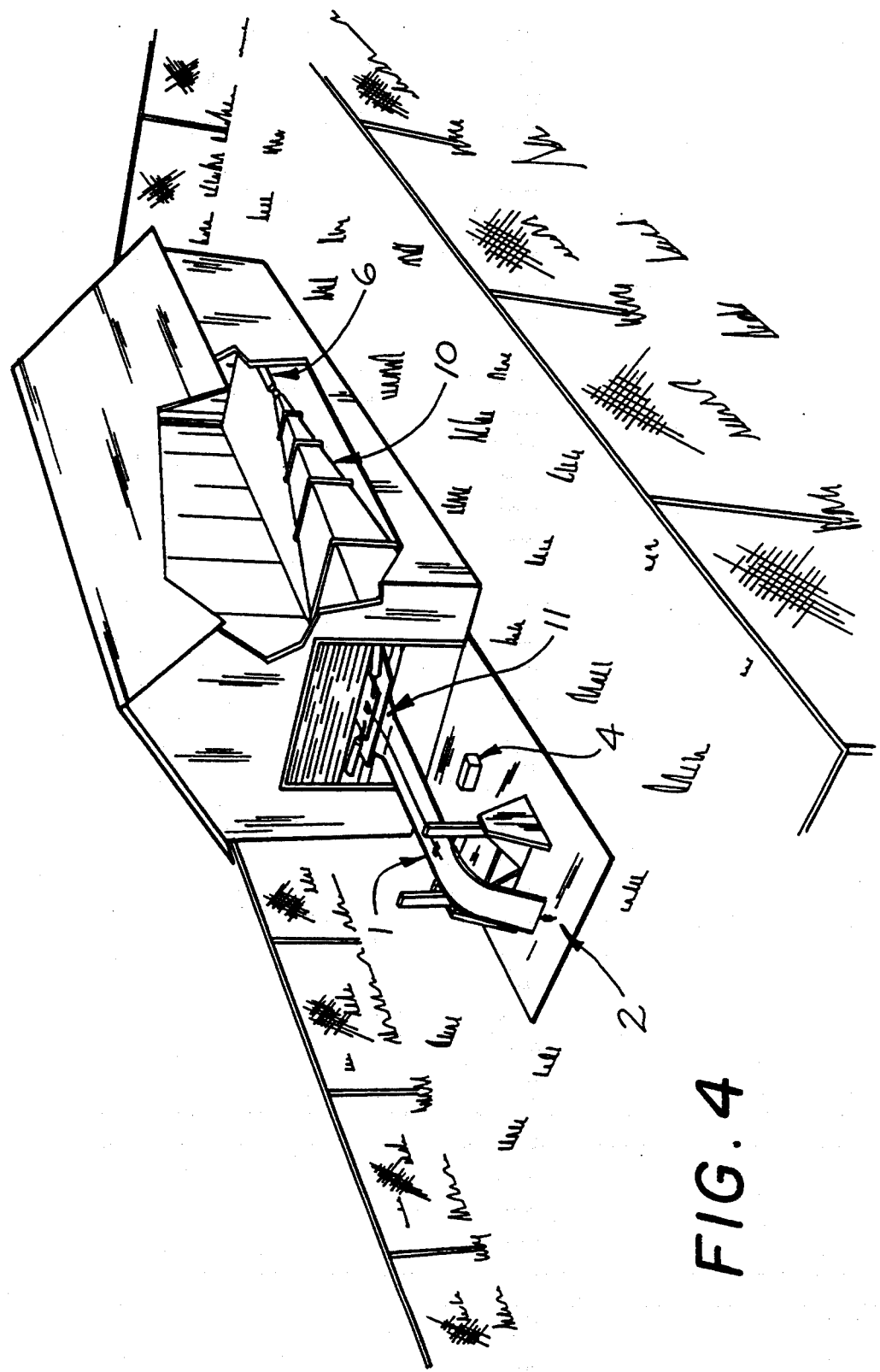
FIG. 4 shows use of the simulator in free space.

The test apparatus can be used in an anechoic chamber 32 as shown in FIG. 3 provided with absorbers 31 or in a shielded room having only side walls lined with anechoic material. Other reference numerals in FIG. 3 correspond to those already shown in FIG. 1. Alternatively, the test apparatus can be used in an unbounded electromagnetic field configuration as shown in FIG. 4. Again the same reference numerals are used in FIG. 1.

A modification of the simulator uses two building, each of the type shown in FIG. 4, facing one another with an open space between in which is located the support 19. The terminating portion of the forwardly extending plate as well as the transmitting section are thus under cover. A further modification of the simulator shown in FIGS. 1 and 5 uses shielded side walls to reduce any electromagnetic leakage to acceptable levels.

Figure 6:
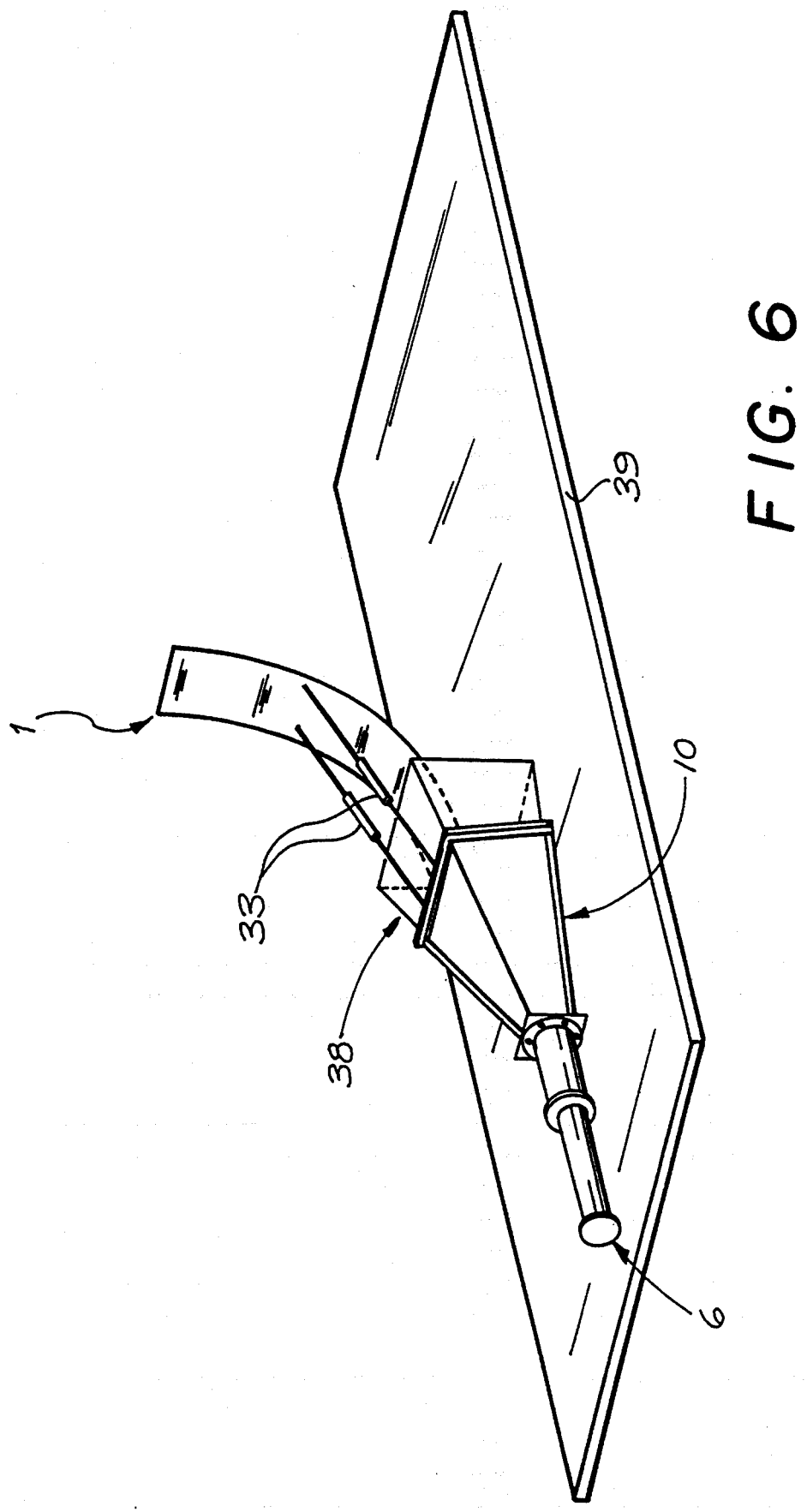
FIGS. 6 to 9 are embodiments of antennas in accordance with the invention.

As is known, due to reciprocity any radiating structure can also function as an antenna. The structure of FIG. 1 can also act as a sensitive wide band antenna. FIG. 6 is such a modification of the simulator of FIG. 5 adapted to function as an antenna. The vertical ground plane and anechoic material are removed for antenna operation and terminating resistors 33 are connected from about the mid-line of plate 1 to the metal upper edge of the horn. The lower surface of the horn is positioned on a ground plane 39. High voltage insulation 38 separates the septum and plate 1 from the horn itself. The function of resistors 33 is to reduce unwanted reflections.

Figure 7:
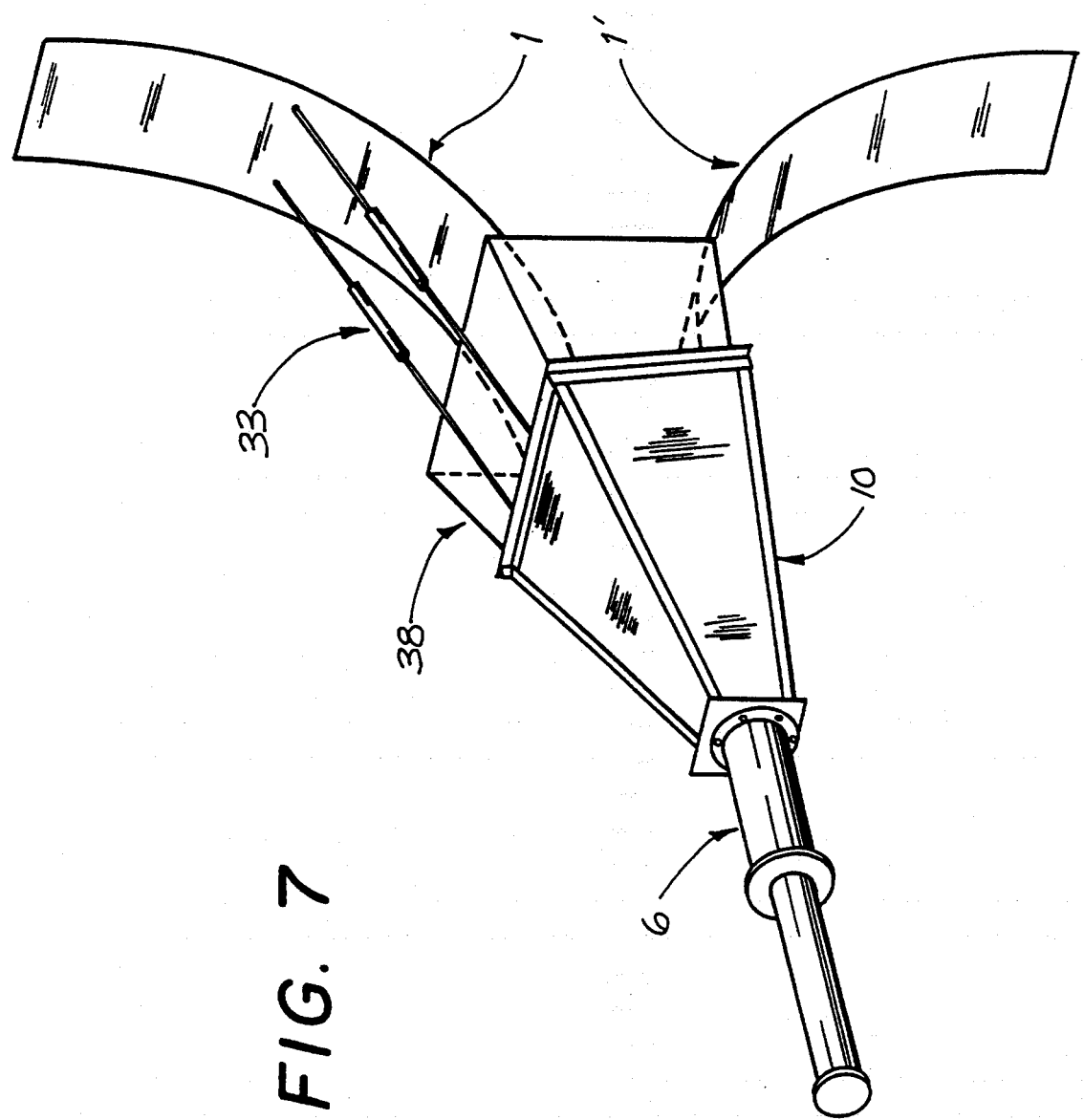
Figure 8:
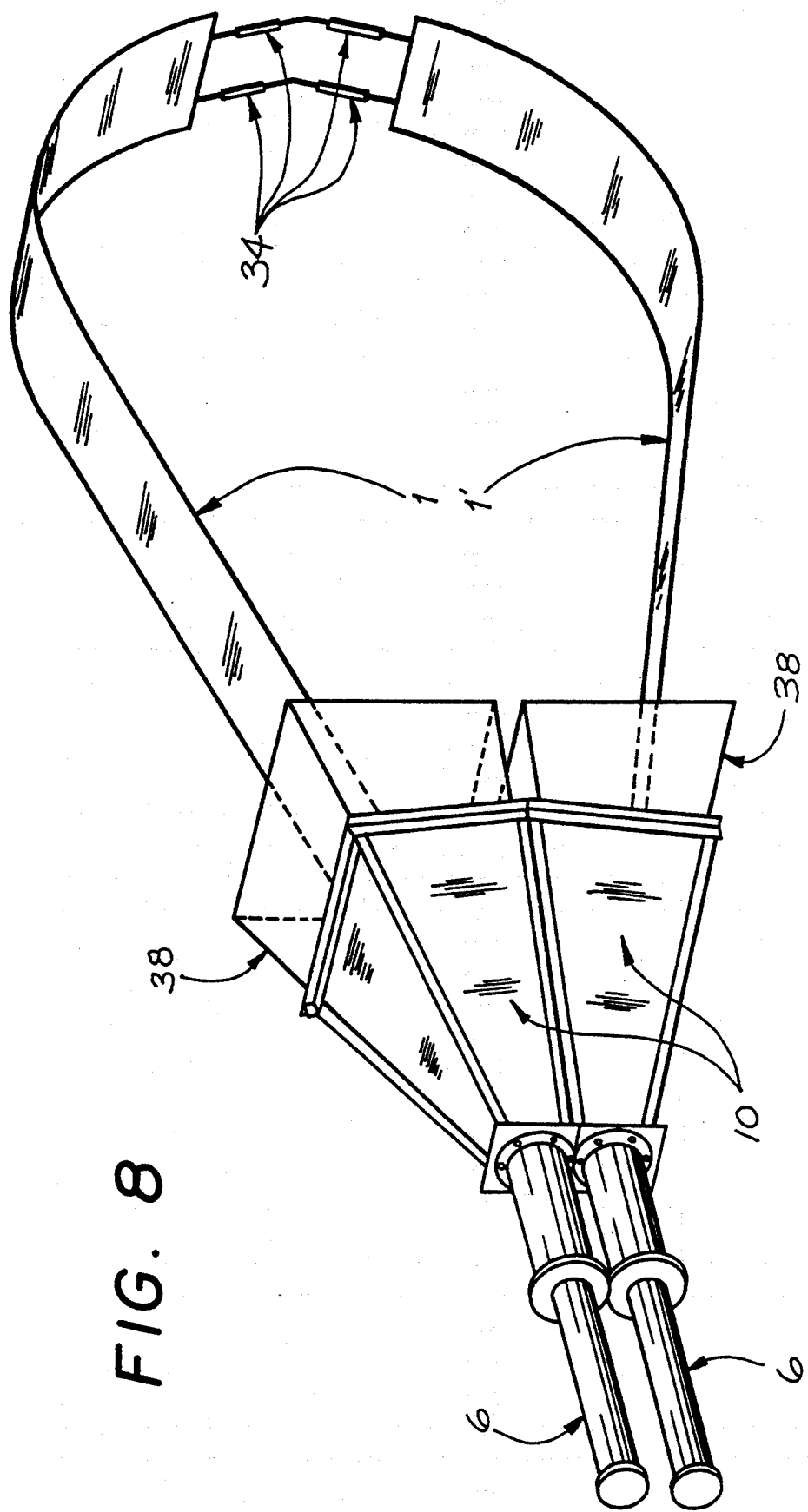
Figure 9:
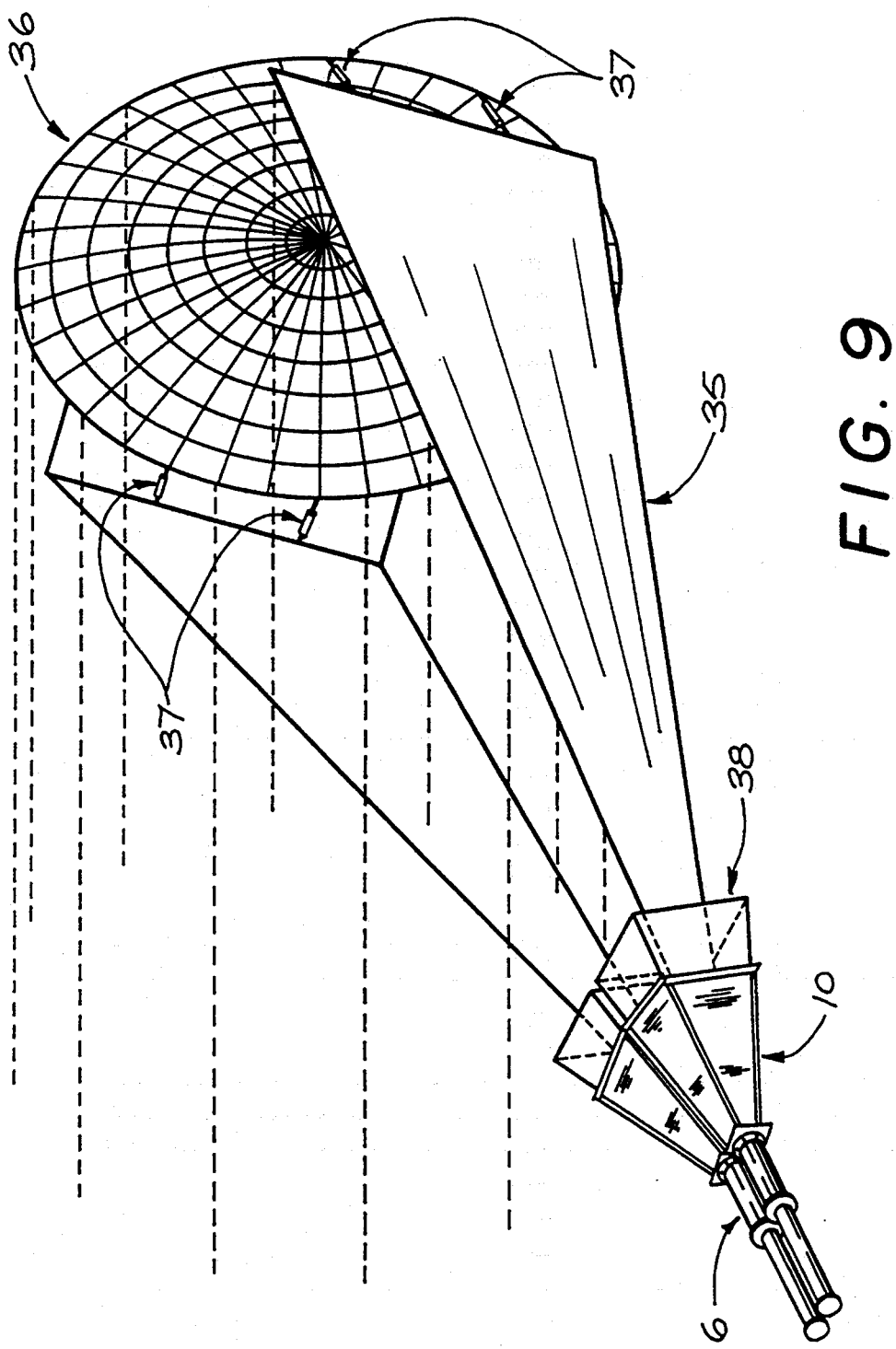

FIG. 7 shows a similar, but more symmetrical arrangement, omitting the ground plane thus avoiding limiting the antenna to signals guided by ground. A pair of forwardly extending plates 1 and 1' define a radiating arrangement with plate 1 connected in a similar fashion as shown in FIG. 6 but plate 1' connected to the lower front edge of the horn. FIG. 8 shows a similar but completely symmetrical arrangement in which a pair of structures of the type shown in FIG. 1 are provided with radiating horns connected along one edge and forwardly extending plates 1 and 1' are joined at their free ends by terminating resistors 34. The horns require separate feeds 6 and 6'. FIG. 9 shows a still further modified antenna which uses a reflector 36 fed by a pair of symmetrically arranged horns having forwardly extending conductive plates 35 conforming in shape to the curvature of reflector 36 and connected to the reflector by terminating resistors 37.

Figure 10:
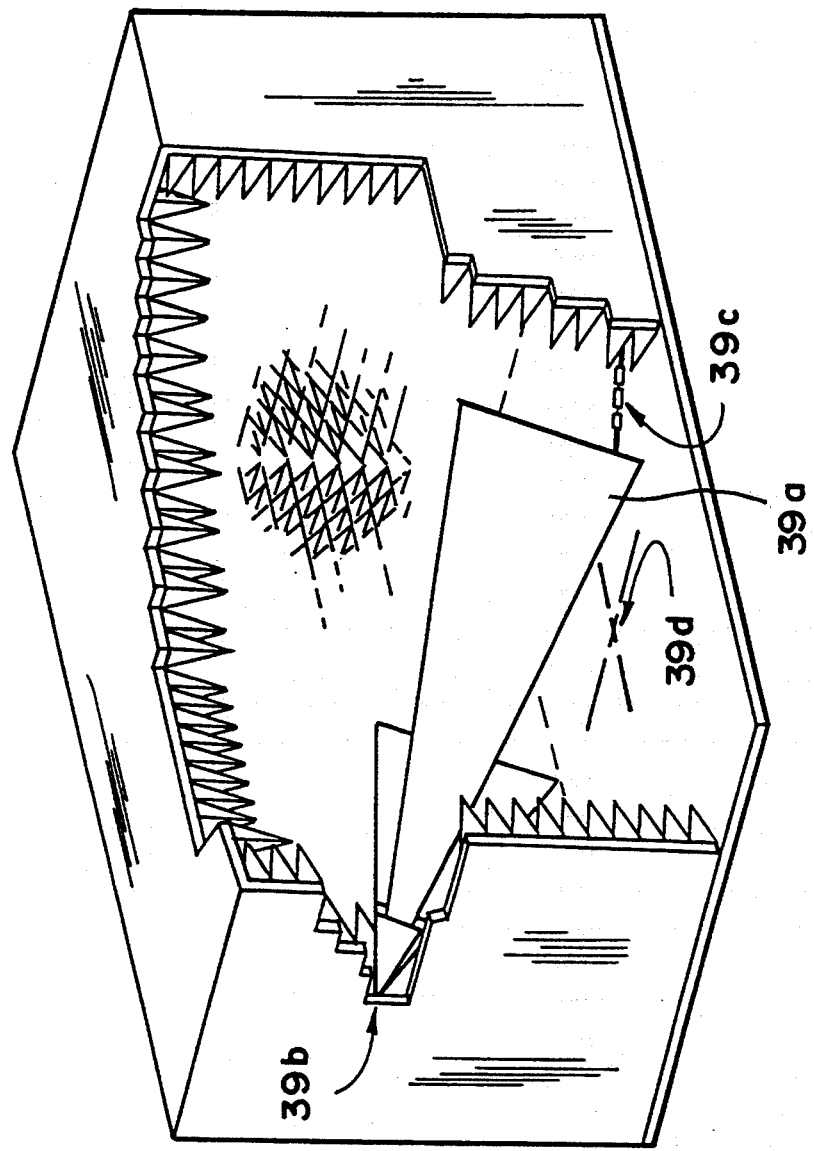
FIG. 10 is a modification of the simulator shown in FIG. 3.

Such double horn antennas can also be used in a modification of the electromagnetic simulator of FIG. 3, shown in FIG. 10. The simulator shown in FIG. 10 has two plates or septums 39a extending from the antennas at an r.f. input 39b into the anechoic chamber and terminating at a resistive load 39c at the end of the side walls of the anechoic chambers on either side of a test area 39d. The simulator projects into the anechoic chamber at an angle in respect to the ground. Such design is advantageous for an anechoic chamber with a ground plane, since it can simulate the effects of ground reflection. In the case of an anechoic chamber without ground (all six walls covered with absorbing material), or in the case of an open field simulator, the simulator of FIG. 10 can be arranged parallel to the ground, simulating a perfectly horizontal polarization. The use of such double-horn simulators permits the simulation of horizontal polarization, providing broadband simulation for both vertical and horizontal polarizations.

FIG. 11 shows a further form of structure useful both as an antenna or a simulator employing similar concepts as in the previously discussed embodiments. A horn 40, located on a ground plate 48, is provided with a pair of septums 41 and 42 separated by an insulating member 43. As a result septums 41 and 42 are capacitively coupled. A forwardly located conductive plate with sections 44 and 45 is connected to the upper and lower septum edges by wires 47. The wires from the upper septum have resistors 46 along their length and the wires from the lower septum edge are continuous. Plate sections 44 and 45 may be formed from wire mesh and act as radiators when used as an antenna. Resistors 46 provide appropriate matching to avoid reflections. The antenna can be used with a reflector as discussed in relation to FIG. 9.

When used as a simulator the area under the wires defines a test volume. It is necessary to terminate the simulator with termination resistors and an absorbing wall as shown for the embodiment of FIG. 5.

Thus, there has been disclosed broadband antennas and broadband gigahertz field simulators capable of generating high power values of field distributed uniformly across a test volume. The simulator has the following advantages:

Reduced cost of testing by making possible susceptibility and emission testing in one simulator.

Provision of a wide-band simulator that can be used in both open field and shielded environments.

Provision for time (impulse), frequency (cw) and current injection testing with one simulator by suitably changing source 6.

Provision of both testing and calibration facilities in one simulator.

Provision of easily accessible large (multi-meter height) testing volume.

Extension of the maximum frequency of operation into microwave (GHz) frequencies for testing of large height (multi-meter) objects.

As a result, the low cost, extremely accurate, calibration simulator can be substituted for bulky TEM cells presently used for calibration. The advantage of this simulator, over others presently in use, is that it can be easily incorporated into existing shielded or anechoic enclosures thereby eliminating any environmental concerns by preventing the radiation of high electromagnetic fields into the environment. This is done without reduction of the bandwidth or the size of tested objects.

The structure has been shown to be useful as a broadband high power radiator and a broadband sensitive listening device for electronic warfare applications.

We claim:

1. An antenna comprising:
an open horn waveguide with an upper and a lower surface, a mouth and a ground plane conductor forming a forward extension of the lower surface;
a thin conducting plate positioned to form a septum between the upper and lower surfaces of the horn waveguide, said conducting plate being insulated from said horn waveguide; and
a conducting section of approximately the same width as the septum, coupled thereto and protecting from and beyond the mouth of the horn waveguide, said conducting section extending initially substantially parallel to the ground plane conductor and then curving downwardly to terminate adjacent to it;
whereby the protecting conducting section functions as a radiating element.

2. An antenna as set out in claim 1 wherein the coupling between the septum and the projecting conducting section consists of a distributed capacitor in parallel with a coupling inductance.

3. An antenna as set out in claim 2 wherein the coupling between the septum and the projecting conducting section further includes a plurality of terminating resistors between the septum and the horn waveguide.

4. An antenna as set out in claim 1 wherein the projecting conducting section is coupled to the ground plane conductor through a terminating resistor.

5. An antenna as set out in claim 1 further comprising a support for the projecting conducting section positioned at a forward edge of a space defining a test volume.

6. An antenna comprising:
an open horn waveguide with an upper and a lower surface, a mouth and a ground plane conductor forming a forward extension of the lower surface;
a thin conducting plate positioned to form a septum between the upper and lower surfaces of the horn waveguide;
a conducting section of approximately the same width as the septum, coupled thereto and projecting from and beyond the mouth of the horn waveguide, said conducting section extending upwardly away from the ground plane conductor; and
resistive means connected between a mid-point of the conducting section and the horn waveguide;
whereby the projecting conducting section functions as a radiating element.

7. An antenna comprising:
an open horn waveguide with an upper and a lower surface, and a ground plane conductor forming a forward extension of the lower surface;
a pair of conducting plates positioned to form an upper and lower septum, respectively, between the upper and lower surfaces of the horn waveguide;
a conducting section spaced forwardly of the horn waveguide; and
a plurality of laterally spaced conductors connecting a front edge of each septum to a rear edge of the conducting section;
whereby the conducting section functions as a radiating element.

8. An antenna as set out in claim 7 wherein the conductors extending between the front edge of the upper septum and the conducting section each contain a resistive section.

9. A broadband electromagnetic field simulator comprising:
an open horn waveguide with an upper and a lower surface, a mouth and a ground plane conductor forming a forward extension of the lower surface;
a source of r.f. energy coupled to an apex of the horn waveguide;
a thin conducting plate positioned to form a septum between the upper and lower surfaces of the horn waveguide, said conducting plate being insulated from said horn waveguide; and
a conducting section of approximately the same width as the septum, coupled thereto and protecting from and beyond the mouth of the horn waveguide, said conducting section extending initially substantially parallel to the ground plane conductor and then curving downwardly to terminate adjacent to it;
whereby the projecting conducting section functions as a radiating element and a space between it and the ground plane conductor defines a test volume.

10. A simulator as set out in claim 9 wherein the coupling between the septum and the projecting conducting section consists of a distributed capacitor in parallel with a coupling inductance.

11. A simulator as set out in claim 10 wherein the coupling between the septum and the projecting conducting section further includes a plurality of terminating resistors between the septum and the horn waveguide.

12. A simulator as set out in claim 9 wherein the projecting conducting section is coupled to the ground plane conductor through a terminating resistor.

13. A simulator as set out in claim 9 further comprising a support for the projecting conducting section positioned at a forward edge of the space defining the test volume.

14. A simulator as set out in claim 9 wherein at least the conducting section and ground plane conductor are contained in an anechoic chamber.

15. A broadband electromagnetic field simulator comprising:
- an open horn waveguide with an upper and a lower surface, a mouth and a ground plane conductor forming a forward extension of the lower surface;
- a source of r.f. energy coupled to an apex of the horn waveguide;
- a thin conducting plate positioned to form a septum between the upper and lower surfaces of the horn waveguide;
- a vertical grounded wall spaced from and facing the mouth of the horn waveguide; and
- a conducting section of approximately the same width as the septum, coupled thereto and projecting from and beyond the mouth of the horn waveguide, said conducting section extending initially upwardly away from the ground plane conductor and then extending substantially horizontally to terminate at the vertical grounded wall;
whereby the projecting conducting section functions as a radiating element and a space between it and the ground plane conductor defines a test volume.

16. A simulator as set out in claim 15 wherein the coupling between the septum and the projecting conducting section consists of a distributed capacitor in parallel with a coupling inductance.

17. A simulator as set out in claim 16 wherein the coupling between the septum and the projecting conducting section further includes a plurality of terminating resistors between the septum and the horn waveguide.

18. A simulator as set out in claim 15 wherein the projecting conducting section is coupled to the vertical grounded wall through a terminating resistor.

19. A simulator as set out in claim 15 further comprising a support for the protecting conducting section positioned at a transition between its upward curve and its substantially horizontal extension.

20. A simulator as in claim 15 wherein side of the vertical grounded wall facing the horn waveguide is covered with anechoic material.

* * * * *

UNITED STATES PATENT AND TRADEMARK OFFICE
CERTIFICATE OF CORRECTION

PATENT NO. : 5,440,316
DATED : August 8, 1995
INVENTOR(S) : ANDREW S. PODGORSKI ET AL.

It is certified that error appears in the above-indentified patent and that said Letters Patent is hereby corrected as shown below:

Claim 1, column 5, lines 42 and 43 of the claim, "protecting" should read --projecting--; and line 48 of the claim, "protecting" should read --projecting--.

Signed and Sealed this

Seventeenth Day of October, 1995

*Attest:*

BRUCE LEHMAN

*Attesting Officer*      Commissioner of Patents and Trademarks